United States Patent
Cummings

(12) 
(10) Patent No.: US 6,444,398 B1
(45) Date of Patent: Sep. 3, 2002

(54) METHOD FOR MANUFACTURING A SEMICONDUCTOR WAFER USING A MASK THAT HAS SEVERAL REGIONS WITH DIFFERENT SCATTERING ABILITY

(75) Inventor: Kevin David Cummings, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 98 days.

(21) Appl. No.: 09/614,828

(22) Filed: Jul. 12, 2000

Related U.S. Application Data

(63) Continuation of application No. 09/201,007, filed on Nov. 30, 1998, now Pat. No. 6,140,020.

(51) Int. Cl.[7] .................................................. G03F 7/20
(52) U.S. Cl. ........................ 430/296; 430/311; 430/394; 430/396; 430/942; 250/492.2
(58) Field of Search ................................. 430/296, 311, 430/394, 396, 942; 250/492.2

(56) References Cited

U.S. PATENT DOCUMENTS

| | | | |
|---|---|---|---|
| 5,308,741 A | 5/1994 | Kemp | 430/312 |
| 5,728,492 A | * 3/1998 | Kawata | 430/5 |
| 5,942,760 A | 8/1999 | Thompson et al. | 250/492.2 |
| 6,221,537 B1 | * 4/2001 | Thompson et al. | 430/5 |
| 6,297,169 B1 | * 10/2001 | Mangat et al. | 438/736 |

FOREIGN PATENT DOCUMENTS

| | | |
|---|---|---|
| EP | 669636 A1 * | 8/1995 |
| JP | 10-270315 * | 10/1998 |

\* cited by examiner

*Primary Examiner*—Mark F. Huff
*Assistant Examiner*—Nicole Barreca
(74) *Attorney, Agent, or Firm*—Keith E. Witek; Robert A. Rodriguez

(57) ABSTRACT

A lithographic mask (FIG. 9 or FIG. 10) that is primarily used for SCALPEL processing has a substrate (100). Layers (102, 104, 106, 108, 110, and 112) are formed and selectively patterned and etched to form E-beam exposure windows (118) and skirt regions (120) framing the windows (118). The skirt regions (120) and some portions of the patterned features (124) within the window (118) are formed having thicker/thinner regions of material or formed of different material whereby different regions of the mask (FIG. 9) scatter energy to differing degrees. The different scattering regions on the mask allow SCALPEL patterns to be formed on the wafer with improved critical dimension (CD) control, reduced aberrant feature formation, and improved yield.

20 Claims, 5 Drawing Sheets

US 6,444,398 B1

METHOD FOR MANUFACTURING A SEMICONDUCTOR WAFER USING A MASK THAT HAS SEVERAL REGIONS WITH DIFFERENT SCATTERING ABILITY

This is a continuation and is based on prior U.S. patent application Ser. No. 09/201,007, filed on Nov. 30, 1998 now U.S. Pat. No. 6,140,020, which is hereby incorporated by reference, and priority thereto for common subject matter is hereby claimed.

FIELD OF THE INVENTION

The present invention relates generally to semiconductor manufacturing, and more particularly to, a process for forming features on a semiconductor wafer using a SCattered Angular Limited Projection E-Beam Lithography (SCALPEL) process.

BACKGROUND OF THE INVENTION

One goal in modern semiconductor fabrication is to improve the density of active elements provided on a single semiconductor die, thus increasing the number of die per wafer. As is known in the art, very large scale integration (VLSI) has evolved into ultra-high large scale integration (ULSI) where tens or hundreds of millions of active elements and devices are placed into a single integrated circuit (IC) die. This density is obtained by currently making devices that have a smallest-possible physical device dimension (i.e., critical dimension (CD)) on the order of 0.18 micron. In order to continue to improve this density without significantly increasing die size, and more importantly, to continue to improve device speed, there is a desire to further decrease the critical dimensions (CDs) of active elements and other devices on the semiconductor die beyond 0.18 micron.

Lithographic techniques are typically used in the formation of multi-level circuits on a semiconductor die. Currently, lithographic techniques take advantage of i-line (365 nanometer) and deep ultra-violet (DUV, 248 nanometer) energy sources to make 0.25 to 0.18 micron device dimensions. By decreasing wavelength of the energy utilized in these lithographic techniques, smaller active elements and transistors may be realized by enabling the creation of smaller critical dimensions (CDs). Accordingly, smaller wavelength, higher energy sources have been investigated for lithographic use in the IC industry, including deep ultra-violet (DUV) (193 nanometers), extreme ultra violet (EUV), approximately 11.0 to 13.4 nanometers), and X-ray sources.

Another lithographic technique, projection electron beam lithography (EBL), shows potential in meeting the future needs of the IC industry, including increased throughput and fine critical dimension (CD) control. In general, a projection electron-beam lithography system scans a beam at extremely high speeds across a masked surface to create an image on a semiconductor device. Electron optics can be inserted in the E-beam path to provide a means of advantageous image reduction. One specific type of projection electron beam lithography is known as SCattering with Angular Limitation in Projection Electron-Beam Lithography (SCALPEL). The basic principles of the SCALPEL technique are illustrated in prior art FIG. 1.

Turning to FIG. 1, the basic principles of SCALPEL are illustrated. As shown, a mask 10 having a patterned scattering layer 14 is provided on membrane 12, through which an electron beam (E-beam) is projected as represented by the arrows at the far left of FIG. 1. Particularly, the patterned scattering layer 14 contains material having a higher atomic number than that of the membrane 12. The scattering effect of the electron beam through portions of the mask is illustrated in FIG. 1 between membrane 12 and a lens 20. As shown, those portions of the electron beam that pass through the scattering layer 14 tend to be scattered to a greater extent as compared with those portions of the E-beam that pass through the membrane material having no overlying scattering layer 14.

In FIG. 1, the electron beam passes through the mask 10 and is focused through an electron focusing system, represented by lens 20. The electron beam (E-beam) then passes through back focal plane filter 30. The filter 30 has an aperture that is provided to permit passage of those portions of the electron beam that were not scattered by the scattering layer of the mask 10. In other words, beams that were scattered at or greater than some finite threshold angle are not passed through the filter 30 while all beams having a scattering angle at less than the some finite threshold angle are passed by the filter 30. The portion of the electron beam passing through the filter 30 is then projected onto a semiconductor wafer 40 having a plurality of die 42 and a resist layer 44 formed thereon. The resist layer is formed by conventional techniques such as by spin coating and baking processes.

The electron beam forms an image in the photoresist of the wafer 40. The image includes areas of high exposure intensity formed by those portions of the electron beam that pass between patterned portions 14 of the mask 10, and areas of relatively low exposure intensity formed by those portions of the electron beam that pass through the patterned areas 14 of the mask 10. Therefore, via a light scattering technique, a high-resolution image may be projected onto the resist layer 44, which is then developed to form a patterned resist layer 44 as shown in FIG. 1. Thereafter, the material exposed through the patterned resist layer may be etched or developed using an appropriate etchant. It is noted that the power of the system may be adjusted so as to provide a 3–5× reduction in image size, typically 4× is a common image reduction size.

Turning to FIG. 2, a top perspective plan view of the mask 10 of FIG. 1 is illustrated. Mask 10 illustrates four adjacent windows, where one window is labeled as window 50. It is noted that typically an array of windows, such as a 8-by-60 array of windows, are formed on a wafer where many more than just the four representative windows in FIG. 2 are formed on the mask 10. In essence, only four windows 50 in FIG. 4 are provided in FIG. 2 for ease of illustration. Each window 50 includes a data field region 52 bounded by a skirt region 54. As illustrated, a plurality of patterned features 48, which make up the scattering layer 14 are formed within the data field region 52. During patterning, exposure of the windows 50 is "stepped" over a surface of a semiconductor device in X-Y location increments, so as to form a contiguous pattern 60, as illustrated in FIG. 3. Each of the windows 50 is butted or stitched together via fine lithographic alignments such that the contiguous pattern 60 is formed from the segmented mask windows 50 of FIG. 2. In this regard, the separated windows in FIG. 2 are slightly overlapped with each other as indicated by the dotted lines 58 in FIG. 3 in order to form the contiguous pattern on the wafer. The overlapping of the windows 50 during exposure forms first overlap region 58a and second overlap region 58b which intersect each other at multiple overlap region 50c.

Along first overlap region 58a, and along second overlap region 58b, the semiconductor device is subjected to energy exposure two times or 2× the typical exposure. Along multiple overlap region 50c, the semiconductor wafer is exposed to the electron beam four times and therefore receives 4× the normal exposure due to overlapping of windows 50 during E-beam exposure.

The present inventor has recognized that multiple exposures along overlap regions 58a–58b and 50c are problematic. Particularly, as is understood in the art, the materials provided for formation of the scattering layer 14 to form the patterned features 48 is effective to provide an image contrast on the order of 5 to 6. In other words, the portions of the semiconductor device corresponding to the patterned features 48 receive ⅕th to ⅙th the intensity of the electron beam as compared to unpatterned regions or unmasked portions of the mask 10. According, exposure at multiple overlap region 50c becomes problematic, since multiple overlap region 50c receives a ⅕th dose of electrons four times (4×), which tends to result in an unwanted definition of a feature on the substrate in this multiple overlap region 50c.

A further problem with this prior art process is illustrated in connection with FIG. 4. As illustrated, window 50 includes first and second patterned features 48, each of which are relatively large and positioned in close proximity to each other as is common in the IC art. As is understood, the electron beam is exposed along patterned features 48 as previously discussed with respect to FIG. 1. Electrons are scattered by the material on mask 50 to different degrees thereby forming features 48 on the wafer. Electrons may be scattered to such an extent that scattering around the edges of the regions 48 causes an uneven exposure or graded exposure of the photoresist around the edges of mask regions 48 as shown in FIG. 4. Thus, in the case of relatively large features, a relatively large number of electrons are being scattered, which may lead to proximity errors arising or significant energy exposure to occur between the features where such exposure is not desired.

As illustrated in FIG. 4, the proximity error is illustrated by the thin separation region lying between the features 48. Typically, the photoresist is chemically developed where resist regions that are exposed at a level greater than $D_0$ is removed while the resist regions that are exposed at a level less than $D_0$ remains on the wafer (or vice versa). Therefore, where the quantum of exposure is above dose $D_0$, which is the minimum dose to complete exposure of the photoresist, a pattern is formed. Accordingly, the features may not be accurately written onto the semiconductor device, and may overlap or bleed into each other, thereby causing electrical short circuits or adversely altering critical device dimensions (CDs) where the regions 48 are either shorted to each other as in FIG. 4 or at least have improper physical dimensions on the wafer.

Accordingly, it is quite clear that a need exists in the art for an improved method of forming a semiconductor device utilizing SCALPEL technology, particularly a technique and a mask therefor that overcome the proximity errors described above in connection with FIG. 4, as well as the exposure errors in connection with FIGS. 2 and 3 described above.

Figure 1:
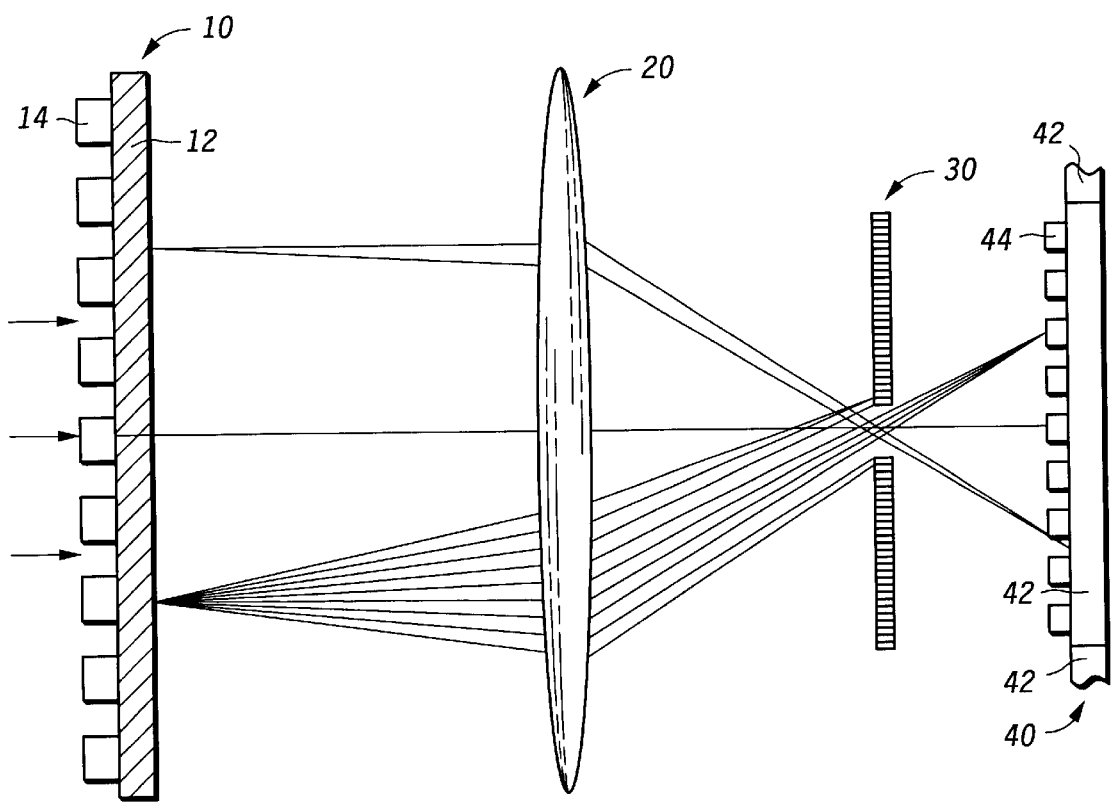
FIG. 1 illustrates, in a cross sectional diagram, the principles of SCattering with Angular Limitation in Projection Electron-beam Lithography (SCALPEL) technologies as such is known in the prior art.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF THE DRAWINGS

As discussed above in FIGS. 1–4, the prior art SCALPEL mask has windows that are overlapped or stepped during exposure operation whereby certain portions of the die may be inherently exposed to energy in four sequential time periods to create a 4× exposure region. If the skirt region of the mask is designed so that 20% of the energy pass onto the wafer through the skirt, then four exposures through this overlapping skirt region would result in 80% total exposure in some areas 50c whereby an aberrant pattern may be formed at this location. This aberrant pattern formation may be reduced or avoided if the skirt of a SCALPEL mask may be formed so that it passes much less energy, say 5% by example. If such a skirt can be made without affecting, or even improving, the patterned features. in the SCALPEL windows, then 4× exposed regions will be exposed only to 20% total exposure which is adequate in SCALPEL processing to avoid creation of an aberrant patterned region. A process for forming a SCALPEL mask having such features and advantages is taught herein via FIGS. 5–11.

FIGS. 5–9 illustrate a method for forming a SCALPEL mask in accordance with the present invention.

Figure 5:
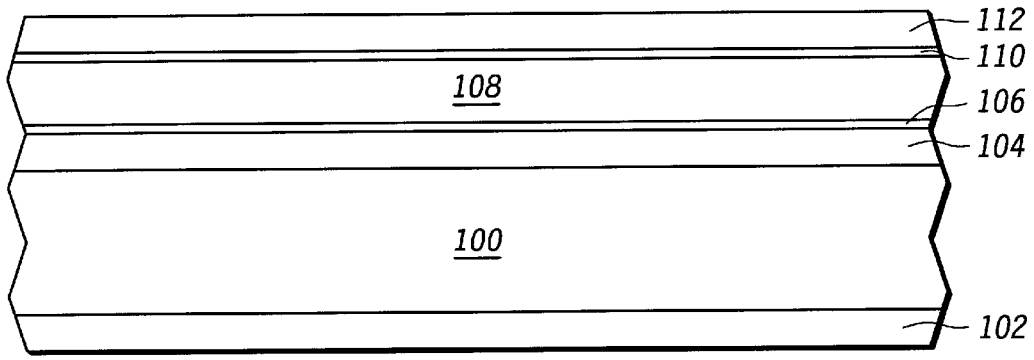
FIGS. 5–9 illustrate several process steps for forming a lithographic mask according to an embodiment of the present invention.

FIG. 5 illustrates a first stage in the formation of a SCALPEL mask according to an embodiment of the present invention. More particularly, FIG. 5 illustrates a substrate 100, having a plurality of layers formed thereon. The substrate 100 is generally formed of doped or undoped silicon, such as a silicon wafer, although other materials may be substituted for a silicon wafer such as a silicon on insulator (SOI) material, germanium silicon, gallium arsenide, silicon carbide, and/or the like. A membrane layer 104 is deposited over a first main surface (or top side) of the substrate 100, while a masking layer 102 is deposited over a second main surface (or back surface) of the substrate 100. Both the membrane layer 104 and the masking layer 102 are generally formed at the same time, via the same chemical vapor deposition (CVD) step. The masking layer 102 and the membrane layer 104 generally have a thickness on the order of 600 to 2,000 angstroms, and are. formed of silicon-rich silicon nitride. Silicon-rich silicon nitride is used for optimal stress characteristics, that is, to match the stress characteristics of the membrane layer 104 with those of the substrate 100. However, other materials or composite materials may be used for the layer 104 and layer 102, and these layers may be formed by separate deposition steps in different semiconductor tools.

Following deposition of layers 102 and 104, a first etch stop layer 106 is formed as shown in FIG. 1. First etch stop layer 106 generally comprises chrome, Cr. However, silicon oxynitride, other metallics, composites thereof, and/or other materials may be substituted for the Cr layer 106. The etch stop layer 106 generally has a thickness on the order of 200 to 250 angstroms. Without limiting the layer 106 to any specific range, the thickness of layer 106 should be any thickness sufficient to ensure a continuous layer of material, but generally, a conformal thin layer is optimal.

Following formation of the first etch stop layer 106, a first scattering layer 108 is deposited in FIG. 1. The scattering layer comprises a material having an atomic number greater than roughly 72. One embodiment utilizes tantalum silicide (TaSi) or tantalum silicon nitride (TaSiN). The first scatter layer generally has a thickness on the order of 2,000 to 5,000 angstroms, more particularly, on the order of 3,000 to 4,000 angstroms. Like the first etch stop layer 106; the first scatter layer 108 may be formed by physical vapor deposition (PVD) such as sputtering.

Following deposition of the first scatter layer 108, a second etch stop layer 110 is formed with similar materials and techniques as described above for first etch stop layer 106. Subsequently, a second scatter layer 112 is formed, in a manner similar to the first scatter layer 108 discussed above. While the second scatter layer 112 may be essentially identical to the first scatter layer 108, it may have a greater thickness, or even be made of different materials so as to alter the scattering properties, such as scattering ability, of the second scatter layer 112, which subsequently forms a portion of the skirt region (the skirt region 28 was first illustrated and discussed in the prior art FIG. 2).

Figure 6:
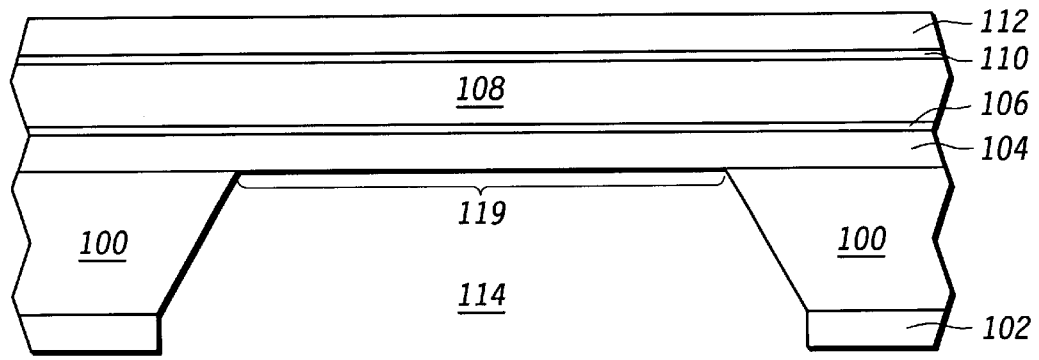

In FIG. 6, processing is continued from FIG. 5 by forming opening 114 at through a back surface in the substrate 100. Opening 114 is formed by patterning the masking layer 102 with photoresist, selectively exposing and developing the photoresist to define the opening geometry 114, and by finally reactive ion etching (RIE) through layer 102 to expose substrate 100. Subsequently, the opening is extended through layer 100 by etching layer 100 in a hot KOH environment. The KOH is selective to the silicon-rich silicon nitride material of the membrane layer 104, and thus stops thereon. Formation of the opening 114 defines window region 119 in FIG. 6, which is comprised of the layers that overlie the opening 114.

Figure 7:
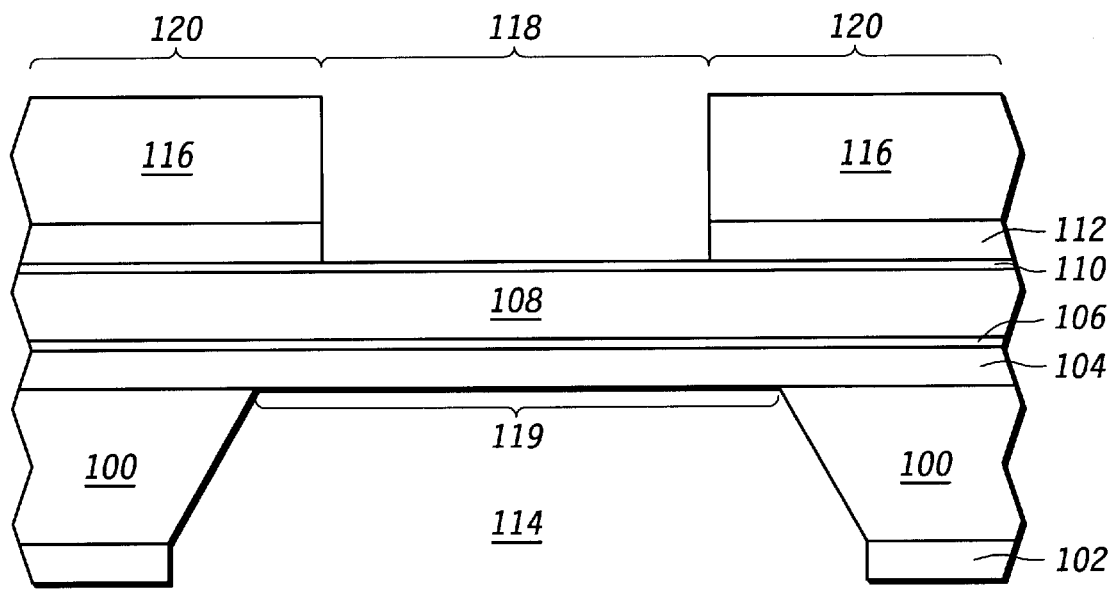

In FIG. 7, processing continues by depositing a first photoresist layer 116 on the other side (top side) of the mask structure, energy exposing and developing the photoresist 116, and subsequently patterning the second scatter layer 112. Such processing leaves behind a field region 118 (in which pattern features are formed), and a skirt region 120. Specifically, the photoresist is generally sensitive to electron beams for patterning, and several E-beam resists are commercially available from companies such as Shilpley. After exposure to the electron beam, the photoresist 116 is then developed and patterned in a conventional manner. Patterning of the second scatter layer may be done by reactive ion etching (RIE), such as by inductively coupled plasma (ICP). As shown, it is noted that the skirt region 120 overlies a portion of window 119, which enhances the accuracy of alignment or butting of the SCALPEL windows during patterning of the semiconductor device. Generally, the skirt regions 120 and the data field 118 in FIG. 7 collectively define one window of many of the SCALPEL mask.

Figure 8:
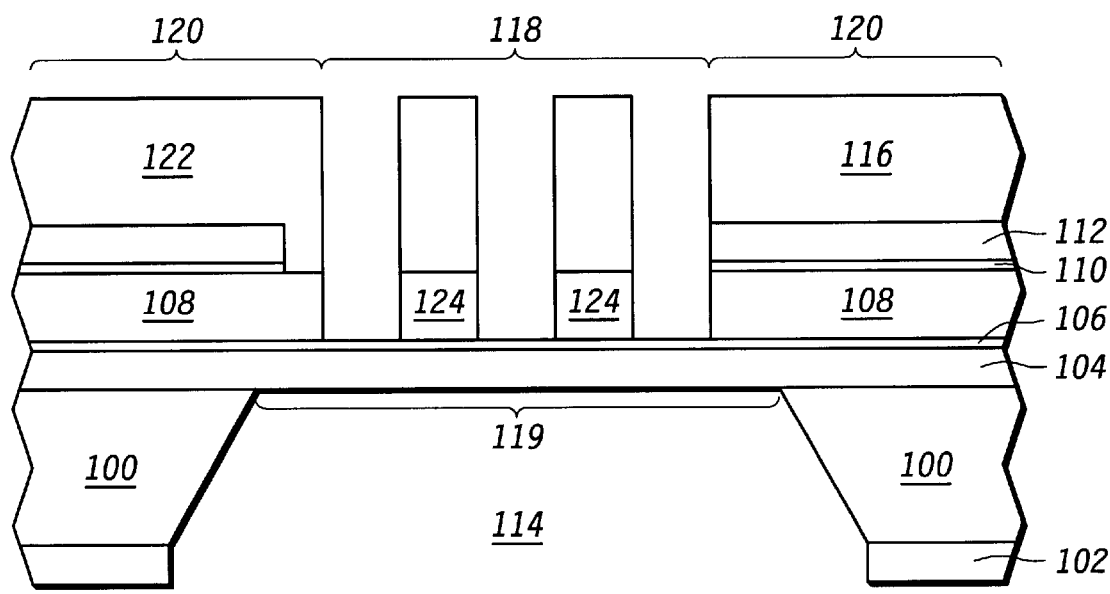
Figure 9:
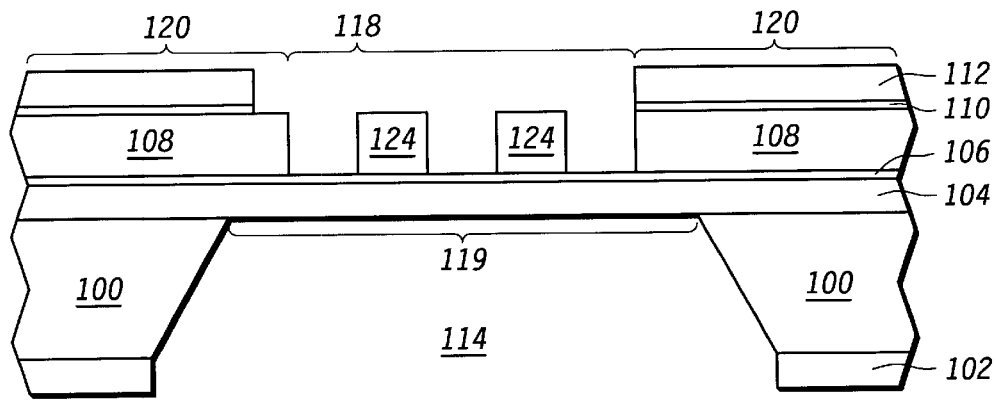

The patterned features 124 are then defined from layer 108 by removing first photoresist layer 116, depositing, developing and patterning a second photoresist layer 122, in a manner similar to that described above for other photoresist layers. FIG. 8 shows that it is acceptable to have some minor lithographic misalignment between the photoresist 122 and the photoresist 116. The data field region 118 is now defined by the inner periphery of the second scatter layers 112. It is noted that a feature to the left in the data field 118 in FIG. 8 butts up directly against first scatter layer 108. The mask is then completed as shown in FIG. 9 by removing the second photoresist layer 122.

FIGS. 5–9 illustrate a novel SCALPEL mask that will have novel applications as discussed later is subsequent paragraphs. The use of the mask of FIG. 9 will have some significant improvements over the prior art mask discussed via FIGS. 1–4.

Figure 10:
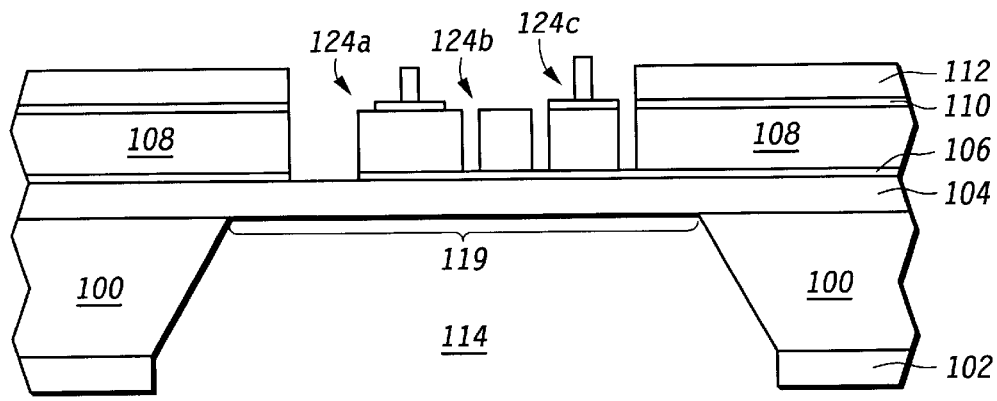
FIG. 10 illustrates a second mask made accordance with another embodiment of the present invention.

FIG. 10 illustrates a second embodiment of a lithographic mask, particularly, a SCALPEL mask, according to the present invention. Here, the multi-layer techniques described above with respect to FIGS. 5–9 .are utilized to form patterned features that also have a multiple layer structure in addition to the skirt region. In FIG. 10, a first patterned feature 124a includes first etch stop layer 106, first scatter layer 108, second etch stop layer 110, and second scatter layer 112. In this embodiment, the thickness of etch stop layer 106 may be increased, whereby the material (e.g., Cr) may be effective to provide a scattering function. In contrast, second patterned feature 124b is formed of only first etch stop layer 106 and first scatter layer 108. Third patterned feature 12c parallels first patterned feature 124a. In the embodiment shown in FIG. 10, the skirt is defined by the first and second etch stop layers, as well as the first and second scatter layers, similar to the embodiment shown in FIG. 9. Different layers can be left behind of different mesas in FIG. 10 by changing the exposure pattern of the photoresist layers (e.g., layer 116 and 122) in FIGS. 5–9. Such multi-tiered structures allow different scattering profiles for different mesas, which is advantageous in many circumstances.

Figure 2:
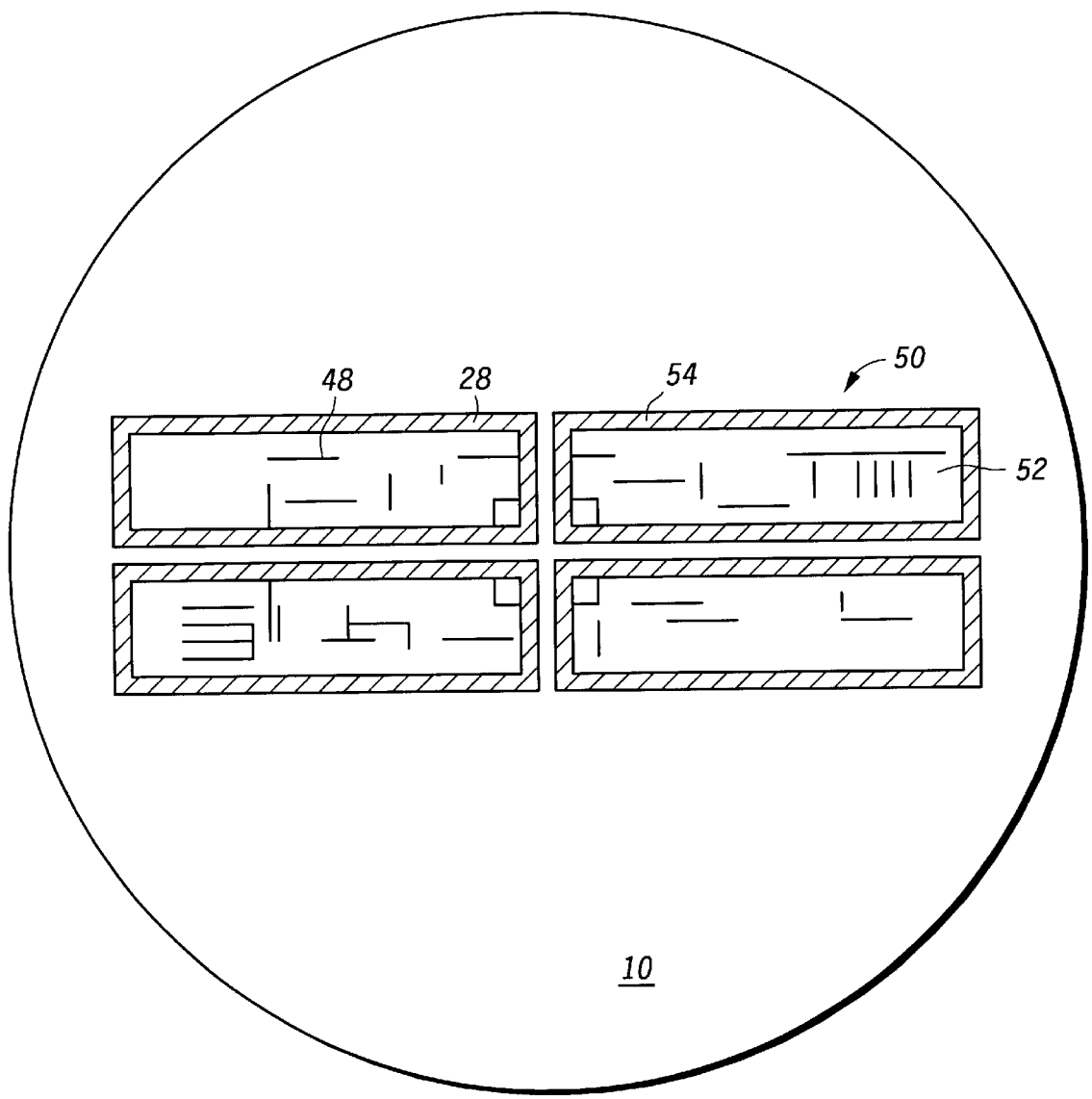
FIG. 2 illustrates, in a top perspective plan view, a SCALPEL mask having a plurality of windows for use in the prior art.
Figure 3:
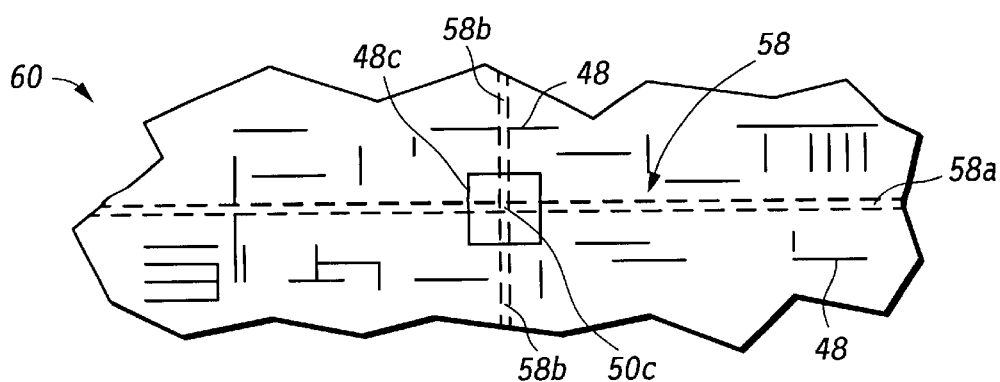
FIG. 3 illustrates, in a top perspective plan view, a pattern on a semiconductor device wafer that is replicated from the patterned features of the mask shown in FIG. 2.
Figure 4:
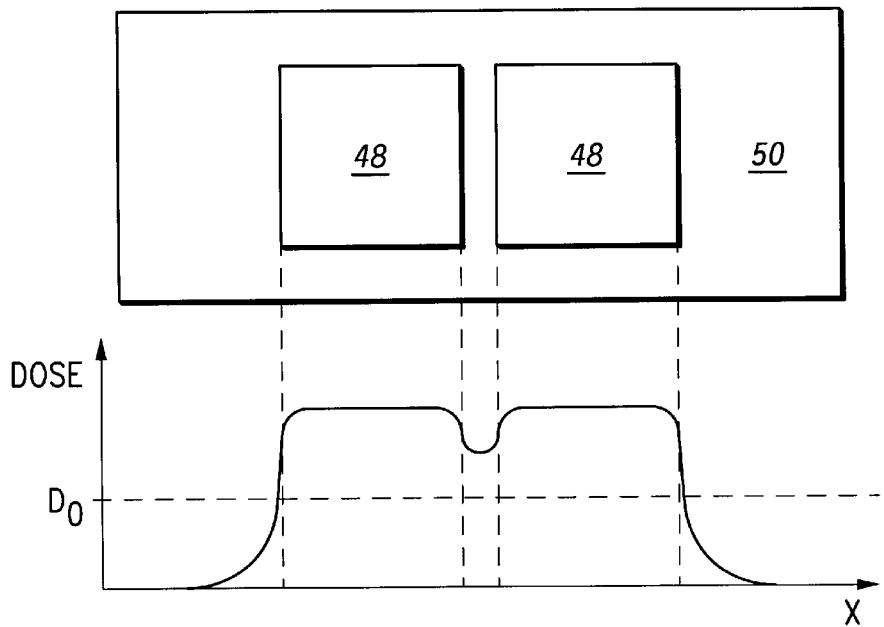
FIG. 4 illustrates, in a combined plan view and X-Y plot, proximity. errors that usually occur in connection with SCALPEL processing as is known in the prior art.

The embodiments of the present invention described above can be utilized in a method for patterning a photoresist on a semiconductor device using a SCALPEL process similar to that illustrated in connection with FIG. 1. Particularly, a semiconductor device having a photoresist layer thereon is provided. The mask is placed in proximity to the semiconductor device. Then, an energy beam, particularly an electron beam in the case of the SCALPEL technique, is irradiated through mask. The electron beam is focused by a lens system, and portions of the energy beam (i.e., largely the unscattered portions of the electron beam) pass through an aperture, thereby defining a pattern on the photoresist provided over the active surface of the semiconductor device/wafer. Accordingly, individual die of the wafer may be patterned by stitching together the various windows of the mask to form a contiguous pattern on the semiconductor device as shown in FIGS. 2–3.

Unlike the prior art, a stack of scatter layers is provided on the membrane of FIGS. 5–10, wherein a first portion of the stack, has a first scattering ability, and a second portion has a second scattering ability, wherein the first and second scattering abilities are different from each other. In connection with FIG. 9, first and second portions having different scattering abilities are defined by patterned features 124 and skirt region 120. According to this embodiment, the patterned features 124 may have a contrast with unpatterned portions of the mask in the range of 5 or 6. However, because of the increased thickness and/or additional materials provided along the skirt region 120, the skirt region provides a higher contrast than the patterned regions 124, such as on the order of 20 or 30. Thus, upon stitching together four adjacent patterns corresponding to four adjacent windows of the mask (see FIGS. 2–3), the quantum of exposure at the central region (see region 50c of FIG. 3) which is exposed four times, is greatly reduced and will not create an aberrant patterned structure on the die/wafer. Specifically, in this regard, please refer to FIG. 3 referenced above, and particularly view the third overlap region 50c. If the material in the skirt is allowing ⅕th to ⅙th of an energy dose to impinge upon the wafer per exposure, the region 50c (exposed four times) would create a region exposed to almost full exposure (e.g., on the order of ⅘ths exposed to energy). When using the improved masks of FIGS. 5–10, the exposure is only ⅟30th or ⅟20th per exposure whereby after four exposures (4×) during stitching or stepping operations in region 50c, the total exposure is still less than ⅕th. Therefore, the aberrant exposures in overlap regions 50c of FIG. 3 are prevented when using the improved masks of FIGS. 5–10.

It is noted that while the second scatter layer 112 may extend so as to overlie and form a portion of all of features 124 as in FIG. 10 for some embodiments, this may be undesirable where the embodiment of FIG. 9 is more preferred is some cases. Particularly, by essentially increasing the thickness of all patterned features (enhancing scattering ability) as in FIG. 10, the patterned features have tendency to absorb additional energy and thus heat the mask during the patterning operation (i.e., during exposure of the mask to an electron beam). This heating may cause shifting of the features along the mask, thus inaccurately replicating the pattern on the semiconductor device or reducing the useful life of the mask. However, the additional thickness provided in the patterned features of FIG. 10, allow differing scattering profiles to be created to enable different critical dimension (CD) formation, different $D_0$ set points (see FIG. 4), etc. In addition, the short circuits and differing CD resolution discussed with respect to FIG. 4 may be by the mask of FIG. 10.

Figure 11:
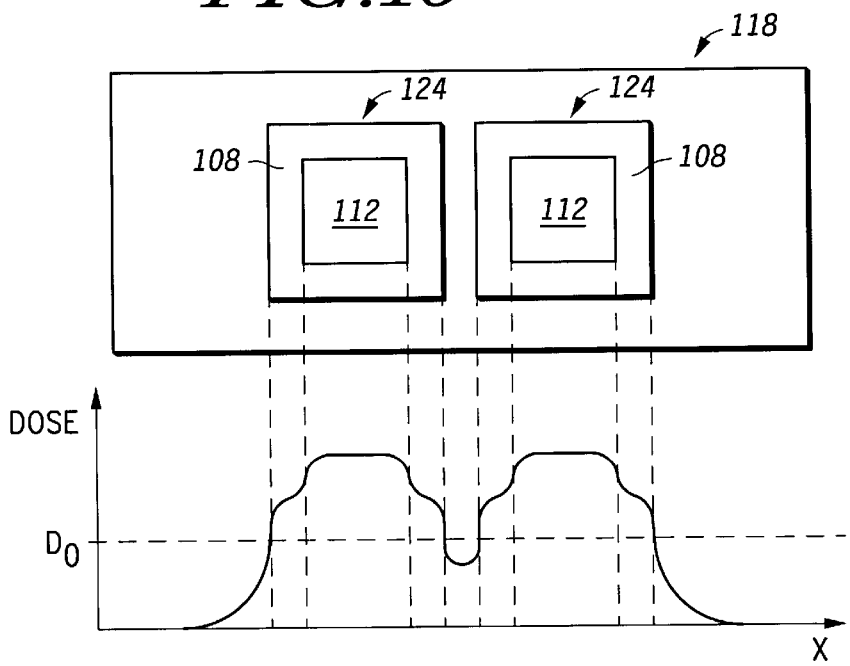
FIG. 11 illustrates a window of a SCALPEL mask having proximity correction in accordance with another embodiment of the present invention.

Specifically, according to the embodiment illustrated in FIG. 10, the proximity errors described above in connection with FIGS. 3 and 4 are attenuated. FIG. 11 shows the dose received along a particular portion of the semiconductor wafer as it corresponds to patterned features 124 within window 118 from FIG. 10. As shown, due to the multiple layer configuration of the patterned features, dosage between the two proximate patterned features 124 is reduced to a level below $D_0$, the minimum dosage level required to complete photoresist exposure. Accordingly, the patterned features 124 are prevented from bleeding into one another, and the present invention is effective to provide proximity error correction, improved CD control, and reduced lithographic scrap due to short circuits. Furthermore, smaller circuit spacings and design rules may be obtained.

While several embodiments of the present invention have been described above with particular detail, it is understood that one of ordinary skill in the art may make modifications thereto yet fall within the scope of the appended claims. For example, while a SCALPEL mask and process is taught herein, other lithographic techniques may benefit from the above teachings.

What is claimed is:

1. A method for manufacturing a semiconductor structure comprising;

positioning a semiconductor substrate in proximity to a mask, the mask having a window that includes a skirt region and a patterned feature region overlying a membrane, wherein a scattering ability or the skirt region is different than a scattering ability of a first scattering element in the patterned feature region; and passing energy through the window to define patterned features on the semiconductor substrate.

2. The method of claim 1, wherein the scattering ability of the skirt region is greater than the scattering ability of the first scattering element.

3. The method of claim 1, wherein the skirt region includes a second scattering film overlying a first scattering film, and wherein the first scattering element includes one of either the second scattering film or the first scattering film.

4. The method of claim 3, further comprising a first etch stop layer disposed between the membrane and the first scattering film and a second etch stop layer disposed between the first scattering film and the second scattering film.

5. The method of claim 1, wherein the mask contains a plurality of windows each having an associated skirt region and an associated pattern feature region, wherein each of the plurality of windows is scanned by an electron beam to define patterned features on the semiconductor substrate, whereby as a result of a scanning overlap by the electron beam between skirt regions of adjacent windows, skirt areas of the semiconductor substrate are exposed multiple times by the electron beam.

6. The method of claim 5, wherein skirt areas of the semiconductor substrate that are exposed multiple times by the electron beam as a result of scanning overlap by the electron beam between skirt regions of adjacent windows are done so without defining a pattern on the semiconductor substrate.

7. The method of claim 1, further comprising a second scattering element, wherein a scattering ability of the second scattering element is different from a scattering ability of the first scattering element.

8. The method of claim 7, further comprising a third scattering element, wherein a scattering ability of the third scattering element is different from a scattering ability of the second scattering element.

9. The method of claim 1, wherein a scattering ability of the skirt region and a scattering ability of the first scattering element are enabled by forming different thicknesses of material on the mask wherein each different thickness corresponds to a different scattering ability.

10. The method of claim 1, wherein a scattering ability of the skirt region and a scattering ability of the first scattering element are enabled by forming different materials of differing atomic weight on the mask, wherein each different materials of differing atomic weight corresponds to a different scattering ability.

11. The method of claim 1, wherein electron beam energy passed through the window produces at least three different doses of energy being delivered to the semiconductor substrate.

12. The method of claim 1, wherein electron beam energy passed through the window produces at least five different doses of energy being delivered to the semiconductor substrate.

13. The method of claim 1, wherein the energy includes an electron beam, and wherein the electron beam passes through the mask at varying scattering angles toward a back focal plane filter positioned between the mask and the semiconductor substrate, wherein an aperture of the back focal plane filter selectively passes or hinders passage of the electron beam depending, upon a scattering angle of the electron beam.

14. A method for manufacturing a semiconductor structure:
  positioning a semiconductor wafer in proximity to a mask, the mask having a plurality of exposure windows wherein each exposure window includes a skirt region containing a skirt structure and a patterned feature region containing first patterned features overlying a membrane, the skirt structure having a first electron scattering ability and the first patterned features having a second electron scattering ability;
  projecting an electron beam through each exposure window on the mask wherein electrons passing through the skirt structure of each exposure window are scattered to a greater degree than electrons passing through the first patterned features; and
  focusing the electron beam after projecting it through each exposure window on the mask toward a back focal plane filter having an aperture that selectively inhibits passing of electrons based upon a degree of scattering so that the first patterned features are exposed onto a patterning layer on the semiconductor wafer.

15. The method of claim 14 further comprising second patterned features within the patterned feature region, wherein the second patterned features have a third electron scattering ability, and wherein the third electron scattering ability is different from the second electron scattering ability.

16. The method of claim 14, wherein the first electron scattering ability is different from the second electron scattering ability as a result of forming scattering material having different thicknesses over different portions of the mask.

17. The method of claim 14, wherein the first electron scattering ability is different from the second electron scattering ability as a result of forming more than one layer of scattering material over different portions of the mask.

18. The method of claim 14, wherein the first electron scattering ability is different from the second electron scattering ability as a result of forming scattering materials having different atomic weights over different portions of the mask.

19. A method for manufacturing a semiconductor structure comprising:
  positioning a semiconductor substrate in proximity to a mask, the mask having a window that includes a scattering element overlying a membrane, wherein a scattering element thickness is varied between central regions and edge regions of the scattering element to define a topographical shape of the scattering element; and
  passing electron beam energy through the window. to define patterned features on the semiconductor substrate, wherein a dose of energy passing through the scattering element is intentionally varied across the scattering element as a result of the topographical shape of the scattering element.

20. The method of claim 19, wherein the scattering element further comprises an upper scattering element portion overlying a lower scattering element portion, wherein at least one of a length and width dimension of the upper scattering element portion is different from at least one of a length and width dimension of the lower scattering element portion.

* * * * *